(12) United States Patent
Castovillo et al.

(10) Patent No.: US 7,150,789 B2
(45) Date of Patent: *Dec. 19, 2006

(54) ATOMIC LAYER DEPOSITION METHODS

(75) Inventors: Paul J. Castovillo, Boise, ID (US); Cem Basceri, Boise, ID (US); Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 369 days.

This patent is subject to a terminal disclaimer.

(21) Appl. No.: 10/208,314

(22) Filed: Jul. 29, 2002

(65) Prior Publication Data

US 2004/0016394 A1  Jan. 29, 2004

(51) Int. Cl.
*C30B 23/00* (2006.01)

(52) U.S. Cl. .............................. 117/84; 117/88; 117/89; 117/92; 117/93; 117/102; 427/255.394

(58) Field of Classification Search ................ 117/102, 117/84, 88, 89, 92, 93; 427/255.394
See application file for complete search history.

(56) References Cited

U.S. PATENT DOCUMENTS

| | | | |
|---|---|---|---|
| 5,879,459 A | 3/1999 | Gadgil et al. ................ 118/715 |
| 5,925,411 A | 7/1999 | van de Ven et al. ..... 427/248.1 |
| 5,972,430 A * | 10/1999 | DiMeo |
| 6,015,597 A * | 1/2000 | David |
| 6,174,377 B1 | 1/2001 | Doering et al. .............. 118/729 |
| 6,197,120 B1 * | 3/2001 | David |
| 6,200,893 B1 * | 3/2001 | Sneh |
| 6,270,572 B1 | 8/2001 | Kim et al. |
| 6,287,965 B1 | 9/2001 | Kang et al. .................. 438/648 |
| 6,301,434 B1 | 10/2001 | McDiarmid et al. ........ 392/416 |
| 6,305,314 B1 * | 10/2001 | Sneh et al. .............. 118/723 R |
| 6,355,561 B1 * | 3/2002 | Sandhu et al. ............... 438/676 |
| 6,387,185 B1 | 5/2002 | Doering et al. .............. 118/729 |
| 6,391,785 B1 | 5/2002 | Satta et al. .................. 438/704 |
| 6,403,156 B1 * | 6/2002 | Jang |
| 6,426,307 B1 | 7/2002 | Lim ........................... 438/778 |
| 6,451,119 B1 * | 9/2002 | Sneh |
| 6,451,695 B1 * | 9/2002 | Sneh |

(Continued)

FOREIGN PATENT DOCUMENTS

KR           440064 B * 7/2004

(Continued)

OTHER PUBLICATIONS

U.S. Appl. No. 10/121,302, filed Apr. 11, 2002, Carpenter.

(Continued)

*Primary Examiner*—Yogendra Gupta
*Assistant Examiner*—G. Nagesh Rao
(74) *Attorney, Agent, or Firm*—Wells St. John P.S.

(57) ABSTRACT

An atomic layer deposition method includes positioning a semiconductor substrate within an atomic layer deposition chamber. A first precursor gas is flowed to the substrate within the atomic layer deposition chamber effective to form a first monolayer on the substrate. After forming the first monolayer, a reactive intermediate gas is flowed to the substrate within the deposition chamber. The reactive intermediate gas is capable of reaction with an intermediate reaction by-product from the first precursor flowing under conditions of the reactive intermediate gas flowing. After flowing the reactive intermediate gas, a second precursor gas is flowed to the substrate within the deposition chamber effective to form a second monolayer on the first monolayer. Other aspects and implementations are contemplated.

32 Claims, 2 Drawing Sheets

U.S. PATENT DOCUMENTS

| | | | |
|---|---|---|---|
| 6,468,924 B1* | 10/2002 | Lee | |
| 6,475,276 B1 | 11/2002 | Elers et al. | 117/84 |
| 6,475,286 B1 | 11/2002 | Frijlink | 118/719 |
| 6,475,910 B1 | 11/2002 | Sneh | 438/685 |
| 6,482,262 B1* | 11/2002 | Elers et al. | 117/84 |
| 6,482,476 B1* | 11/2002 | Liu | 427/535 |
| 6,534,395 B1 | 3/2003 | Werkhoven et al. | |
| 6,585,823 B1 | 7/2003 | Van Wijck | |
| 6,586,343 B1* | 7/2003 | Ho et al. | |
| 6,589,886 B1 | 7/2003 | Kim et al. | 438/758 |
| 6,590,251 B1 | 7/2003 | Kang et al. | 257/310 |
| 6,602,784 B1 | 8/2003 | Sneh | 438/680 |
| 6,620,723 B1* | 9/2003 | Byun et al. | 438/627 |
| 6,630,401 B1 | 10/2003 | Sneh | 438/680 |
| 6,638,862 B1 | 10/2003 | Sneh | 438/685 |
| 6,664,192 B1 | 12/2003 | Satta et al. | 438/704 |
| 6,673,701 B1* | 1/2004 | Marsh et al. | 438/493 |
| 6,696,157 B1* | 2/2004 | David et al. | |
| 6,696,368 B1* | 2/2004 | Derraa et al. | 438/761 |
| 6,720,027 B1* | 4/2004 | Yang et al. | |
| 6,727,169 B1* | 4/2004 | Raaijmakers et al. | 438/622 |
| 6,746,952 B1* | 6/2004 | Derraa et al. | 438/627 |
| 6,753,271 B1* | 6/2004 | Sarigiannis et al. | 438/785 |
| 6,821,347 B1* | 11/2004 | Carpenter et al. | 118/696 |
| 2001/0024387 A1 | 9/2001 | Raaijmakers et al. | 365/200 |
| 2001/0041250 A1 | 11/2001 | Werkhoven et al. | 428/212 |
| 2001/0050039 A1 | 12/2001 | Park | |
| 2001/0054381 A1 | 12/2001 | Umotoy et al. | 118/715 |
| 2002/0086111 A1 | 7/2002 | Byun et al. | 427/255.394 |
| 2002/0108714 A1 | 8/2002 | Doering et al. | 156/345.51 |
| 2002/0187256 A1 | 12/2002 | Elers et al. | 427/99 |
| 2003/0031807 A1 | 2/2003 | Elers et al. | 427/569 |
| 2003/0032281 A1 | 2/2003 | Werkhoven et al. | 438/640 |
| 2003/0085424 A1 | 5/2003 | Bryant et al. | 257/347 |
| 2003/0108674 A1 | 6/2003 | Chung et al. | |
| 2003/0129826 A1 | 7/2003 | Werkhoven et al. | 438/627 |
| 2003/0143328 A1* | 7/2003 | Chen et al. | 427/255.28 |
| 2003/0183171 A1 | 10/2003 | Sneh et al. | 118/724 |
| 2004/0033688 A1* | 2/2004 | Sarigiannis et al. | 438/685 |
| 2004/0083959 A1 | 5/2004 | Carpenter et al. | |
| 2004/0137728 A1* | 7/2004 | Gallagher et al. | 438/689 |
| 2005/0037597 A1* | 2/2005 | Nguyen et al. | 438/488 |

FOREIGN PATENT DOCUMENTS

| | | | |
|---|---|---|---|
| WO | 01/27347 A1 | 4/2001 | 16/44 |
| WO | 01/29280 A1 | 4/2001 | 16/32 |
| WO | 01/29893 A1 | 4/2001 | 21/768 |
| WO | WO 10/29893 * | 4/2001 | |
| WO | 01/66832 A2 | 9/2001 | 25/14 |
| WO | PCT/US03/22804 * | 12/2003 | |

OTHER PUBLICATIONS

U.S. Appl. No. 10/132,003, filed Apr. 24, 2002, Dando et al.
U.S. Appl. No. 10/132,767, filed Apr. 24, 2002, Dando et al.
U.S. Appl. No. 10/150,388, filed May 17, 2002, Mardian et al.
U.S. Appl. No. 10/163,671, filed Jun. 5, 2002, Dando et al.
U.S. Appl. No. 10/163,689, filed Jun. 5, 2002, Derderian et al.
U.S. Appl. No. 10/222,282, filed Aug. 15, 2002, Sarigiannis et al.
U.S. Appl. No. 10/222,304, filed Aug. 15, 2002, Sarigiannis et al.
U.S. Appl. No. 10/229,887, filed Aug. 27, 2002, Marsh et al.

* cited by examiner

ATOMIC LAYER DEPOSITION METHODS

TECHNICAL FIELD

This invention relates to atomic layer deposition methods.

BACKGROUND OF THE INVENTION

Atomic layer deposition (ALD) involves the deposition of successive monolayers over a substrate within a deposition chamber typically maintained at subatmospheric pressure. An exemplary such method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

It is a desired intent or effect of the purging to remove gas molecules that have not adsorbed to the substrate or unreacted gas or reaction by-products from the chamber to provide a clean reactive surface on the substrate for the subsequent precursor. In the context of this document, a reaction by-product is any substance (whether gas, liquid, solid or mixture thereof) which results from reaction of any deposition precursor flowing to the chamber and that is not desired to be deposited on the substrate. Further in the context of this document, an intermediate reaction by-product or reaction intermediate by-product is a reaction by-product formed by less than complete reaction of a precursor to form a desired monolayer on the substrate. Where there is a great degree of varying topography and/or there are high aspect ratio features on the substrate, it can be difficult to move the unreacted gases or reaction by-products from deep within openings for ultimate removal from the chamber. Further, certain reaction by-products, particularly intermediate reaction by-products, may not be gaseous and may not completely react to form gaseous reaction by-products in the typical short precursor pulse times. Accordingly, the purge gas pulse may not be effective or sufficient in removing such intermediate reaction by-products from the substrate and chamber.

For example, consider that in an atomic layer deposition of titanium nitride using $TiCl_4$ and $NH_3$, the desired deposition product is TiN with HCl gas being the desired principle gaseous by-product. Consider also that there might be reaction intermediate by-products which might, even if gaseous, be difficult to remove from substrate openings. Further, if certain reaction intermediate by-products are solid and/or liquid phase prior to HCl formation, complete removal can be even more problematic where less than complete reaction to TiN and HCl occurs.

Consider also the atomic layer deposition of $Al_2O_3$ using trimethylaluminum (TMA) and ozone as alternating deposition precursors. Apparently in such deposition, achieving an effective ozone precursor feed can be somewhat of a challenge due to the limited lifetime of ozone within the chamber. Specifically, an ozone molecule is in an inherently unstable, reactive form of oxygen which can rapidly dissociate and/or combine with another ozone molecule to form three $O_2$ molecules. Regardless, a desired goal in the ozone feed is adsorption of oxygen atoms from the $O_3$ to the surface of the substrate with $O_2$ as the reaction by-product which is driven off. Of course, the $O_2$ which forms deep within openings on the substrate has to be removed therefrom while more $O_3$ needs to get into the openings to form a complete monolayer of oxygen atoms adhering to the substrate. In other words, the $O_2$ which forms is trying to get out while more $O_3$ is trying to get in.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes atomic layer deposition methods. In one implementation, an atomic layer deposition method includes positioning a semiconductor substrate within an atomic layer deposition chamber. A first precursor gas is flowed to the substrate within the atomic layer deposition chamber effective to form a first monolayer on the substrate. After forming the first monolayer, a reactive intermediate gas is flowed to the substrate within the deposition chamber. The reactive intermediate gas is capable of reaction with an intermediate reaction by-product from the first precursor flowing under conditions of the reactive intermediate gas flowing. After flowing the reactive intermediate gas, a second precursor gas is flowed to the substrate within the deposition chamber effective to form a second monolayer on the first monolayer.

In one implementation, an atomic layer deposition method includes positioning a semiconductor substrate within an atomic layer deposition chamber. A first precursor gas is flowed to the substrate within the atomic layer deposition chamber effective to form a first monolayer on the substrate. After forming the first monolayer, a plurality of inert purge gas pulses are flowed to the substrate within the deposition chamber, with the plurality of inert purge gas pulses including at least some period of time between at least two adjacent inert purge gas pulses when no gas is fed to the chamber. After the plurality of inert purge gas pulses, a second precursor gas is flowed to the substrate within the deposition chamber effective to form a second monolayer on the first monolayer.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
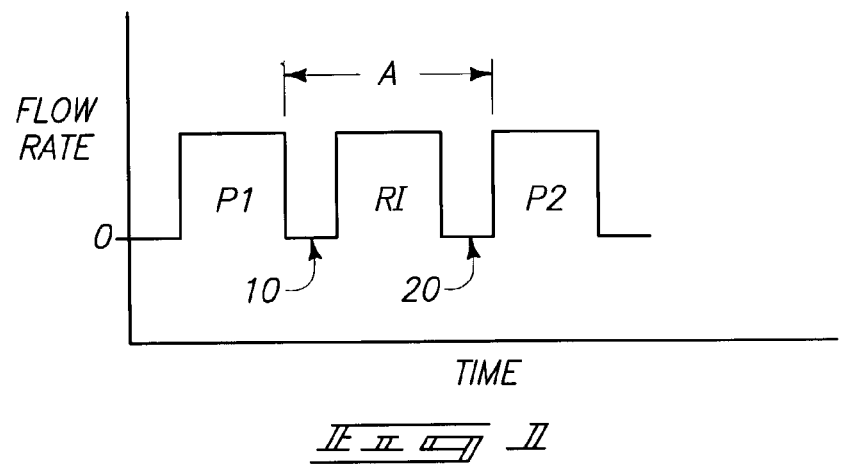
FIG. 1 is a diagrammatic depiction of flow versus time of one atomic layer deposition process in accordance with an aspect of the invention.

This disclosure of the invention is submitted in furtherance of the constitutional purposes of the U.S. Patent Laws "to promote the progress of science and useful arts" (Article 1, Section 8).

An atomic layer deposition method in accordance with an aspect of the invention includes positioning a semiconductor substrate within an atomic layer deposition chamber. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A first precursor gas is flowed to the substrate within the atomic layer deposition chamber effective to form a first monolayer on the substrate. Any first precursor gas is contemplated, whether existing or yet-to-be developed. By way of example only, where a desired ultimate deposition product or layer is TiN, an example first precursor could be either $TiCl_4$ or $NH_3$. Further by way of example only, where the ultimate layer or product being formed is to be $Al_2O_3$, exemplary first precursor gases include trimethylaluminum and ozone. By way of example only, an exemplary first monolayer utilizing $TiCl_4$ would include titanium or a titanium complex, whereas with respect to $NH_3$ such would at least include nitrogen. With respect to trimethylaluminum, the first monolayer would include an aluminum complex, and with ozone typically adhered oxygen atoms. Any suitable temperature, pressure, flow rate or other operating parameters, with or without plasma, can of course be selected and optimized by the artisan with no particular set of the same being preferred or constituting a part of the invention.

After forming the first monolayer, a reactive intermediate gas is flowed to the substrate within the deposition chamber. In the context of this document, a "reactive intermediate gas" is one which is capable of reaction with an intermediate reaction by-product from the first precursor flowing under conditions of the reactive intermediate gas flowing. Further and preferably, the reactive intermediate gas is not capable of reaction with either the first monolayer under the reactive intermediate gas flowing conditions, nor capable of reaction with any of the first precursor which might be remaining in the reactor under the reactive intermediate gas flowing conditions. Further in one preferred embodiment, the reactive intermediate gas is not capable of reaction with, and does not react with, any exposed portion of the substrate under the reactive intermediate gas flowing conditions during such flowing of the reactive intermediate gas.

In one aspect, the invention contemplates reactive intermediate gas flowing regardless of whether any intermediate reaction by-product actually forms during the first precursor gas flowing. Further in another preferred aspect, the invention also contemplates forming some intermediate reaction by-product during the first precursor gas flowing, and then reacting the reactive intermediate gas with the intermediate reaction by-product during the reactive intermediate gas flowing.

The conditions (i.e., temperature, pressure, flow rate, etc.) of the reactive intermediate gas flowing to the substrate within the deposition chamber can be optimized by the artisan and are not otherwise particularly germane or preferred to any aspect of the invention. By way of example only, such conditions might be the same as or different from any of a first precursor gas flow, a second precursor gas flow and/or inert purge gas flow. In one preferred aspect, the reactive gas flowing is plasma enhanced for example by one or both of plasma generation within the chamber and plasma generation remote of the chamber.

The particular reactive intermediate gas selected, whether a single constituent or a mixture of constituents, will depend as a minimum upon at least one intermediate reaction by-product from the first precursor flowing with which the reactive intermediate gas would be capable of reaction under conditions of the reactive intermediate gas flowing. By way of example only, two possible intermediate reactive gas components include $Cl_2$ and $H_2$, and which would be expected to be particularly useful with one or both of $TiCl_4$ and $NH_3$ precursors. For example, with respect to $TiCl_4$ and $NH_3$ reaction by-products, such might include $TiCl_2$, $TiCl_3$ and $NH_3$ complexes. $Cl_2$ and/or $H_2$ could be provided to the reactor for availability to react with these reaction by-products to facilitate their conversion to the ultimate stoichiometric equation reaction by-product (i.e., gaseous HCl), or react to form some other product which might be more easily swept from the reactor either by the flowing reactive intermediate gas, by some other gas or by no other gas flowing.

After flowing the reactive intermediate gas, a second precursor gas is flowed to the substrate within the deposition chamber effective to form a second monolayer on the first monolayer, with "on" of course meaning in at least partial direct physical contact with the first monolayer. The second precursor is typically and preferably different in composition from the first precursor. Further preferably, the reactive intermediate gas is chosen to not be capable of reaction with the second precursor under the reactive intermediate gas flowing conditions. By way of example only, exemplary second precursors include any of the above $TiCl_4$, $NH_3$, TMA and ozone in the respective exemplary deposition reactions referred to above. In accordance with any existing or yet-to-be developed atomic layer deposition method, the formed second monolayer might combine with the first monolayer to thereby inherently form a desired deposition product (i.e., TiN or $Al_2O_3$, with the above referred to respective precursors), or to form a second monolayer that does not necessarily inherently react with the underlying first monolayer. The particular conditions of the flowing of the second precursor can be optimized by the artisan, of course, and do not constitute a material or preferred aspect of the inventions disclosed herein.

By way of example only, FIG. 1 depicts an exemplary plot of flow rate versus time of but one process in accordance with one aspect of the invention. In FIG. 1, P1 refers to a time period during which a first precursor flows to the chamber; RI refers to a time period during which a reactive intermediate gas flows to the substrate; and P2 refers to a time period during which a second precursor flows to the chamber. Accordingly, FIG. 1 depicts a preferred embodiment wherein the first precursor gas flowing, the reactive intermediate gas flowing and the second precursor gas flowing collectively comprise multiple time-spaced gas pulses to the substrate within the deposition chamber. In one preferred embodiment, there is some period of time between the first precursor gas flowing and the reactive intermediate gas flowing during which no gas is fed to the chamber, and as illustrated by example only with respect to location 10. Further in one preferred embodiment, there is a period of time between the reactive intermediate gas flowing and the second precursor gas flowing during which no gas is fed to the chamber and as, by way of example only, is indicated with the numeral 20. The particular length and rates of the respective flowings, and times therebetween, can be optimized by the artisan, of course, and do not constitute a material or preferred aspect of the inventions disclosed herein. Further, a first precursor gas pulse and a second precursor gas pulse are only stated or related temporally, of course, and not necessarily that the first stated precursor gas flowing or pulsing is a first ever precursor flowing to the chamber. Likewise and accordingly depending upon which portion of a time line much like the figures to which one is looking, second precursor gas pulses can be considered as first precursor gas pulses, and vice versa.

Figure 2:
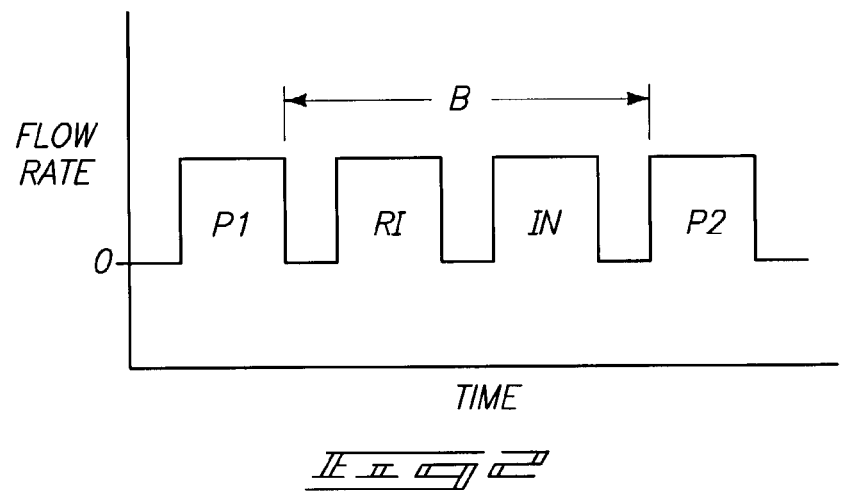
FIG. 2 is a diagrammatic depiction of flow versus time of one atomic layer deposition process in accordance with an aspect of the invention.

FIG. 1 also depicts one embodiment whereby there exists a total period of time "A" between first precursor feeding P1 and second precursor feeding P2. Total period of time A is characterized by no gas being fed to the chamber during said total period but for said reactive intermediate gas flowing RI. However, the invention also contemplates other gas flowings intermediate a first precursor feeding and a second precursor feeding. By way of example only, such are depicted in FIGS. 2–5 in certain aspects. FIG. 2 depicts the flowing of an inert purge gas in the form of an inert gas pulse (IN) which is time-spaced from all other gas flowings to the substrate within the deposition chamber after flowing reactive intermediate gas pulse RI. Accordingly by way of example only, the exemplary diagrammatic FIG. 2 processing depicts a total period of time "B" between first precursor feeding P1 and second precursor feeding P2 having more than just the reactive intermediate gas flow RI.

Figure 3:
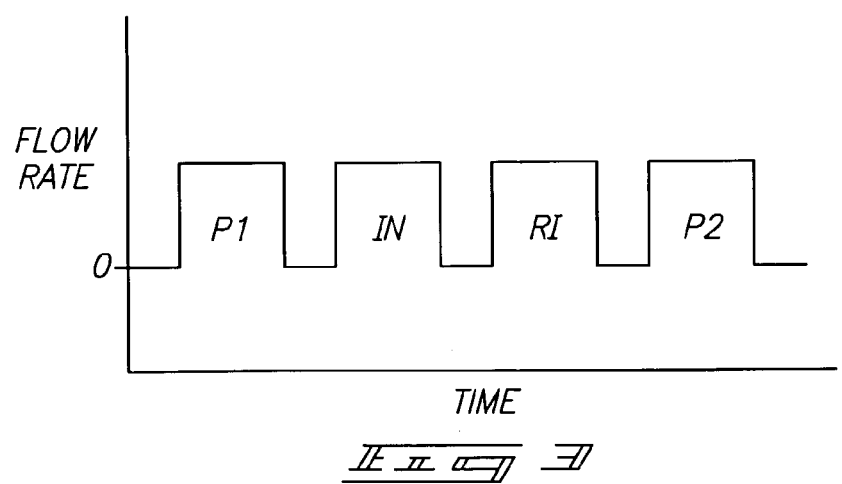
FIG. 3 is a diagrammatic depiction of flow versus time of one atomic layer deposition process in accordance with an aspect of the invention.

FIG. 3 depicts another embodiment similar to FIG. 2, but for the reversal of the sequence of the inert gas pulsing and reactive intermediate gas pulsing between the first and second precursor flows.

Figure 4:
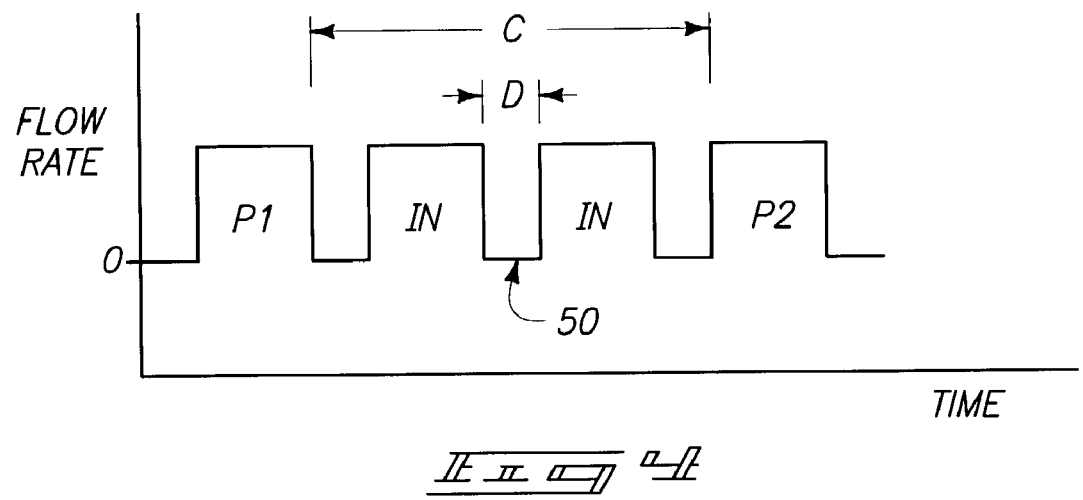
FIG. 4 is a diagrammatic depiction of flow versus time of one atomic layer deposition process in accordance with an aspect of the invention.

FIG. 4 depicts another exemplary atomic layer deposition method which, in certain aspects, is not dependent upon any reactive intermediate gas flowing as described above. Specifically and by way of example only, FIG. 4 depicts, after the forming of a first monolayer from a precursor P1 flowing, a plurality of inert purge gas pulses IN flowing to the substrate within the deposition chamber, with such inert purge gas pulses being time-spaced such that there is at least some period of time (i.e., a period 50) between at least two adjacent inert purge gas pulses IN when no gas is fed to the chamber. By way of example only and in no way of limitation, such multiple, time-spaced inert purge gas pulses might facilitate the removal of reaction intermediate by-products, particularly from within high aspect ratio openings on the substrate. In the context of this document, "two adjacent inert purge gas pulses" refers to two inert purge gas pulses that have no other purge gas pulse therebetween. The phase "two immediately adjacent inert purge gas pulses" refers to two inert purge gas pulses that have no gas pulse therebetween.

FIG. 4 depicts an exemplary embodiment wherein the plurality of inert purge gas pulses intermediate the first and second precursor flowings is two in number. Of course, the number of inert purge gas pulses to the chamber might be more than two in number. Further, the inert purge gas pulses might be of the same or common inert purge gas composition within the illustrated or all of the plurality of purge gas pulses, or be of some degree of varying composition. FIG. 4 also depicts but one preferred embodiment wherein there is a total period of time "C" between the first precursor feeding and the second precursor feeding. Total period of time C is characterized by no gas being fed to the chamber during such total period but for the plurality of inert purge gas pulses IN. Further considered and by way of example only, the depicted exemplary FIG. 4 processing illustrates a total period of time "D" between the illustrated two immediately adjacent inert purge gas pulses IN. Such total period of time D is characterized by no gas being fed to the chamber during such total period D.

Figure 5:
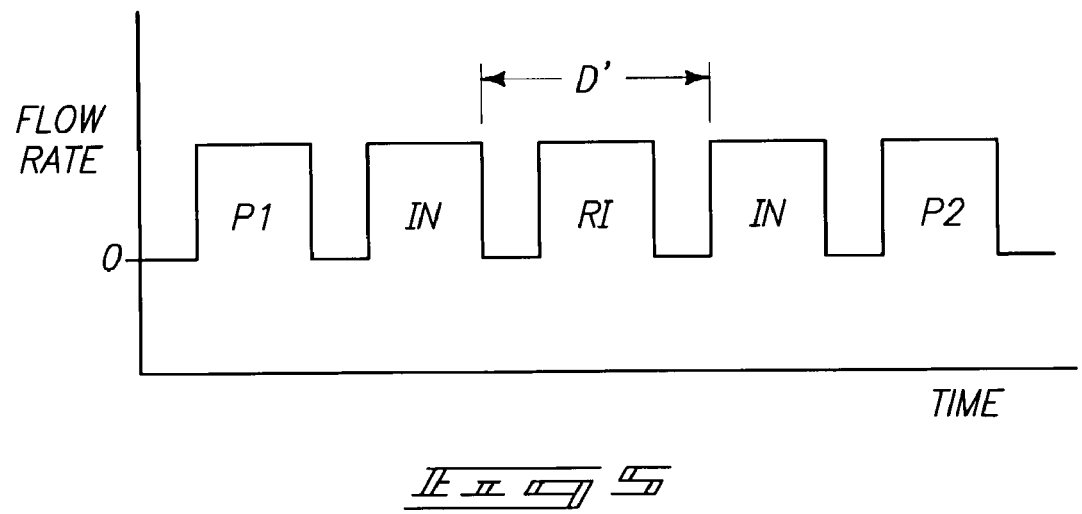
FIG. 5 is a diagrammatic depiction of flow versus time of one atomic layer deposition process in accordance with an aspect of the invention.

By way of example only, FIG. 5 illustrates an exemplary alternate process having a total period of time D' between the two adjacent inert purge gas pulses IN which is characterized by or includes a reactive intermediate gas flowing RI to the substrate within the deposition chamber, for example in accordance with the first-described embodiments. Accordingly and by way of example only, FIG. 5 also depicts in accordance with the first-described embodiments, the flowing of multiple time-spaced inert purge gas pulses IN to the substrate within the deposition chamber intermediate the first precursor flowing and the second precursor flowing. Of course, the IN and RI pulses could be ordered in any conceivable manner between the first and second precursor flowings, as well as other inert gas pulses, reactive intermediate gas pulses or other gas pulses added between the first and second precursor flows P1 and P2, respectively. Further, any processing of the substrate could occur, either before or after the FIGS. 1–5 depicted processings, and the depicted processings would typically and preferably be repeated as selected by the artisan to achieve a desired thickness deposition by atomic layer deposition on the substrate.

The invention might have particular applicability to formation of hemispherical grain polysilicon container capacitors formed within high aspect ratio openings, but is in no way so limited.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method, comprising:
   providing a semiconductor substrate within a deposition chamber;
   flowing a first precursor gas to the substrate within the deposition chamber effective to form a first monolayer on the substrate;
   after forming the first monolayer, flowing a reactive intermediate gas to the substrate within the deposition chamber, the reactive intermediate gas being capable of reaction with an intermediate reaction by-product resulting from the flowing of the first precursor gas under conditions of the flowing of the reactive intermediate gas, the flowing of the reactive intermediate gas being plasma enhanced, the reactive intermediate gas not reacting with the first monolayer during said flowing of the reactive intermediate gas; and after flowing the reactive intermediate gas, flowing a second precursor gas to the substrate within the deposition chamber effective to form a second monolayer on the first monolayer.

2. The method of claim 1 comprising forming the intermediate reaction by-product during the flowing of the first precursor gas and reacting the reactive intermediate gas with the intermediate reaction by-product during the flowing of the reactive intermediate gas.

3. The method of claim 1 wherein the second precursor is different in composition from the first precursor.

4. The method of claim 1 wherein there is a period of time between the flowing of the first precursor gas and the flowing of the reactive intermediate gas during which no gas is fed to the chamber.

5. The method of claim 1 wherein there is a period of time between the flowing of the reactive intermediate gas and the flowing of the second precursor gas during which no gas is fed to the chamber.

6. The method of claim 1 wherein,
there is a first period of time between the flowing of the first precursor gas and the flowing of the reactive intermediate gas during which no gas is fed to the chamber; and
there is a second period of time between the flowing of the reactive intermediate gas and the flowing of the second precursor gas during which no gas is fed to the chamber.

7. An atomic layer deposition method, comprising:
providing a semiconductor substrate within a deposition chamber;
flowing a first precursor gas to the substrate within the deposition chamber effective to form a first monolayer on the substrate;
after forming the first monolayer, flowing a reactive intermediate gas to the substrate within the deposition chamber, the reactive intermediate gas being capable of reaction with an intermediate reaction by-product resulting from the flowing of the first precursor gas under conditions of the flowing of the reactive intermediate gas, the reactive intermediate gas comprising $Cl_2$; and
after flowing the reactive intermediate gas, flowing a second precursor gas to the substrate within the deposition chamber effective to form a second monolayer on the first monolayer.

8. The method of claim 1 wherein the reactive intermediate gas is not capable of reaction with the first precursor under said conditions.

9. The method of claim 1 wherein the reactive intermediate gas is not capable of reaction with the second precursor under said conditions.

10. An atomic layer deposition method, comprising:
providing a semiconductor substrate within a deposition chamber;
flowing a first precursor gas to the substrate within the deposition chamber effective to form a first monolayer on the substrate;
after forming the first monolayer, flowing a reactive intermediate gas to the substrate within the deposition chamber, the reactive intermediate gas being capable of reaction with an intermediate reaction by-product resulting from the flowing of the first precursor gas under conditions of the flowing of the reactive intermediate gas;

after flowing the reactive intermediate gas, flowing a second precursor gas to the substrate within the deposition chamber effective to form a second monolayer on the first monolayer; and
wherein the first precursor comprises $TiCl_4$, the second precursor comprises $NH_3$, and the reactive intermediate gas comprises $Cl_2$.

11. An atomic layer deposition method, comprising:
providing a semiconductor substrate within a deposition chamber;
flowing a first precursor gas to the substrate within the deposition chamber effective to form a first monolayer on the substrate;
after forming the first monolayer, flowing a reactive intermediate gas to the substrate within the deposition chamber, the reactive intermediate gas being capable of reaction with an intermediate reaction by-product resulting from the flowing of the first precursor gas under conditions of the flowing of the reactive intermediate gas;
after flowing the reactive intermediate gas, flowing a second precursor gas to the substrate within the deposition chamber effective to form a second monolayer on the first monolayer; and
wherein the first precursor comprises $NH_3$, the second precursor comprises $TiCl_4$, and the reactive intermediate gas comprises $Cl_2$.

12. The method of claim 1 comprising flowing multiple time spaced inert purge gas pulses to the substrate within the deposition chamber intermediate the flowing of the first precursor gas and the flowing of the second precursor gas.

13. The method of claim 1 wherein the flowing of the first precursor gas, the flowing of the reactive intermediate gas and the flowing of the second precursor gas collectively comprise multiple time spaced gas pulses to the substrate within the deposition chamber.

14. The method of claim 13 comprising a total period of time between the flowing of the first precursor gas and the flowing of the second precursor gas, the total period of time being characterized by no gas being fed to the chamber during said total period but for said flowing of the reactive intermediate gas.

15. The method of claim 1 wherein the flowing of the reactive intermediate gas is plasma enhanced by plasma generation within the chamber.

16. The method of claim 1 wherein the flowing of the reactive intermediate gas is plasma enhanced by plasma generation remote of the chamber.

17. An atomic layer deposition method, comprising:
providing a semiconductor substrate within a deposition chamber;
flowing a first precursor gas to the substrate within the deposition chamber effective to form a first monolayer on the substrate;
after forming the first monolayer, flowing a reactive intermediate gas to the substrate within the deposition chamber, the reactive intermediate gas being capable of reaction with an intermediate reaction by-product resulting from the flowing of the first precursor gas under conditions of the flowing of the reactive intermediate gas, the reactive intermediate gas not reacting with the first monolayer during said flowing of the reactive intermediate gas;
after flowing the reactive intermediate gas, flowing an inert purge gas to the substrate within the deposition chamber; and after flowing the inert purge gas, flowing a second precursor gas to the substrate within the deposition chamber effective to form a second monolayer on the first monolayer.

18. The method of claim 17 wherein the reactive intermediate gas is not capable of reaction with, and does not react with, any exposed portion of the substrate under said conditions during the flowing of the reactive intermediate gas.

19. The method of claim 17 wherein the reactive intermediate gas is not capable of reaction with the first precursor under said conditions.

20. The method of claim 17 wherein the reactive intermediate gas is not capable of reaction with the second precursor under said conditions.

21. The method of claim 17 comprising forming the intermediate reaction by-product during the flowing of the first precursor gas and reacting the reactive intermediate gas with the intermediate reaction by-product during the flowing of the reactive intermediate gas.

22. The method of claim 17 wherein the flowing of the inert purge gas is as a pulse which is time spaced from all other flow of gas, and comprising conducting multiple inert purge gas pulses intermediate the flowing of the first precursor gas and the flowing of the second precursor gas.

23. The method of claim 17 wherein the flowing of the first precursor gas, the flowing of the reactive intermediate gas, the flowing of the inert gas and the flowing of the second precursor gas collectively comprise multiple time spaced gas pulses to the substrate within the deposition chamber.

24. An atomic layer deposition method, comprising:
providing a semiconductor substrate within a deposition chamber;
flowing a first precursor gas to the substrate within the chamber effective to form a first monolayer on the substrate;
after forming the first monolayer, flowing an inert purge gas to the substrate within the deposition chamber;
after flowing the inert purge gas, flowing a reactive intermediate gas to the substrate within the deposition chamber, the reactive intermediate gas being capable of reaction with an intermediate reaction by-product resulting from the flowing of the first precursor gas under conditions of the flowing of the reactive intermediate gas, the reactive intermediate gas not reacting with the first monolayer during said flowing of the reactive intermediate gas; and
after flowing the reactive intermediate gas, flowing a second precursor gas to the substrate within the deposition chamber effective to form a second monolayer on the first monolayer.

25. The method of claim 24 wherein the reactive intermediate gas is not capable of reaction with, and does not react with, any exposed portion of the substrate under said conditions during the flowing of the reactive intermediate gas.

26. The method of claim 24 wherein the reactive intermediate gas is not capable of reaction with the first precursor under said conditions.

27. The method of claim 24 wherein the reactive intermediate gas is not capable of reaction with the second precursor under said conditions.

28. The method of claim 24 comprising forming the intermediate reaction by-product during the flowing of the first precursor gas and reacting the reactive intermediate gas with the intermediate reaction by-product during the flowing of the reactive intermediate gas.

29. The method of claim 24 wherein the flowing of the inert purge gas is as a pulse which is time spaced from all other flow of gas, and comprising conducting multiple inert purge gas pulses intermediate the flowing of the first precursor gas and the flowing of the second precursor gas.

30. The method of claim 24 wherein the flowing of the first precursor gas, the flowing of the inert gas, the flowing of the reactive intermediate gas, and the flowing of the second precursor gas collectively comprise multiple time spaced gas pulses to the substrate within the deposition chamber.

31. The method of claim 17 wherein the flowing of the reactive intermediate gas is plasma enhanced.

32. The method of claim 24 wherein the flowing of the reactive intermediate gas is plasma enhanced.

* * * * *

UNITED STATES PATENT AND TRADEMARK OFFICE
CERTIFICATE OF CORRECTION

| | | |
|---|---|---|
| PATENT NO. | : 7,150,789 B2 | Page 1 of 1 |
| APPLICATION NO. | : 10/208314 | |
| DATED | : December 19, 2006 | |
| INVENTOR(S) | : Castovillo et al. | |

It is certified that error appears in the above-identified patent and that said Letters Patent is hereby corrected as shown below:

Col. 8, line 25, claim 11, please delete "$NH_3$,," after "comprises" and insert --$NH_3$,--.

Signed and Sealed this

Seventh Day of August, 2007

JON W. DUDAS
*Director of the United States Patent and Trademark Office*